(12) United States Patent
Chen et al.

(10) Patent No.: US 10,957,394 B1
(45) Date of Patent: Mar. 23, 2021

(54) NAND STRING PRE-CHARGE DURING PROGRAMMING BY INJECTING HOLES VIA SUBSTRATE

(71) Applicant: SanDisk Technologies LLC, Addison, TX (US)

(72) Inventors: Han-Ping Chen, Santa Clara, CA (US); Wei Zhao, Fremont, CA (US); Henry Chin, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/785,973

(22) Filed: Feb. 10, 2020

(51) Int. Cl.
*G11C 16/10* (2006.01)
*G11C 16/04* (2006.01)
*G11C 16/08* (2006.01)
*H01L 27/11582* (2017.01)
*H01L 27/1157* (2017.01)
*G11C 16/34* (2006.01)

(52) U.S. Cl.
CPC .......... *G11C 16/10* (2013.01); *G11C 16/0483* (2013.01); *G11C 16/08* (2013.01); *H01L 27/1157* (2013.01); *H01L 27/11582* (2013.01); *G11C 16/3459* (2013.01)

(58) Field of Classification Search
CPC ..... G11C 16/10; G11C 16/08; G11C 16/0483; G11C 16/3459; H01L 27/1157; H01L 27/11582
See application file for complete search history.

(56) References Cited

U.S. PATENT DOCUMENTS

| 6,859,397 | B2 | 2/2005 | Lutze et al. |
|---|---|---|---|
| 7,672,169 | B2 | 3/2010 | Ueno |
| 7,952,929 | B2 | 5/2011 | Kim et al. |
| 8,638,606 | B2 | 1/2014 | Zhao et al. |
| 8,917,557 | B2 | 12/2014 | Sakaguchi et al. |
| 8,952,426 | B2 | 2/2015 | Maejima |
| 8,988,937 | B2 | 3/2015 | Dunga et al. |
| 9,245,642 | B1 | 1/2016 | Chen et al. |
| 10,276,242 | B2 | 4/2019 | Kimura |
| 10,541,033 | B2 | 1/2020 | Jung et al. |

(Continued)

OTHER PUBLICATIONS

U.S. Appl. No. 16/200,007, filed Nov. 26, 2018.

(Continued)

*Primary Examiner* — Gene N Auduong
(74) *Attorney, Agent, or Firm* — Vierra Magen Marcus LLP

(57) ABSTRACT

Apparatuses and techniques are described for pre-charging NAND string channels in a pre-charge phase of a program operation. In one aspect, a hole-type pre-charge process is used at the source end of a NAND string, where a bottom of the NAND string is connected to a p-well of a substrate. By applying a positive voltage to the p-well and a lower voltage, such as 0 V or a negative voltage, to the source-side select gate transistors and the memory cells, the holes from the p-well are injected into the channel In another approach, the hole-type pre-charge process and an electron-type pre-charge process are used sequentially in separate time periods. In another approach, the hole-type pre-charge process is used at the source end of a NAND string while the electron-type pre-charge process is used at the drain end of the NAND string.

20 Claims, 14 Drawing Sheets

(56) References Cited

U.S. PATENT DOCUMENTS

| | | |
|---|---|---|
| 2013/0322174 A1 | 12/2013 | Li et al. |
| 2014/0151774 A1* | 6/2014 | Rhie .................. G11C 16/0483 |
| | | 257/314 |
| 2015/0103592 A1* | 4/2015 | Miwa ..................... G11C 16/24 |
| | | 365/185.02 |
| 2015/0255166 A1 | 9/2015 | Tseng et al. |
| 2016/0099066 A1* | 4/2016 | Dunga ................... G11C 16/24 |
| | | 365/185.17 |
| 2019/0348544 A1* | 11/2019 | Rhie ................. H01L 27/11582 |

OTHER PUBLICATIONS

U.S. Appl. No. 16/418,642, filed May 21, 2019.
U.S. Appl. No. 16/528,349, filed Jul. 31, 2019.
International Search Report & The Written Opinion of the International Searching Authority dated Sep. 20, 2020, International Application No. PCT/US2020/035020.

\* cited by examiner

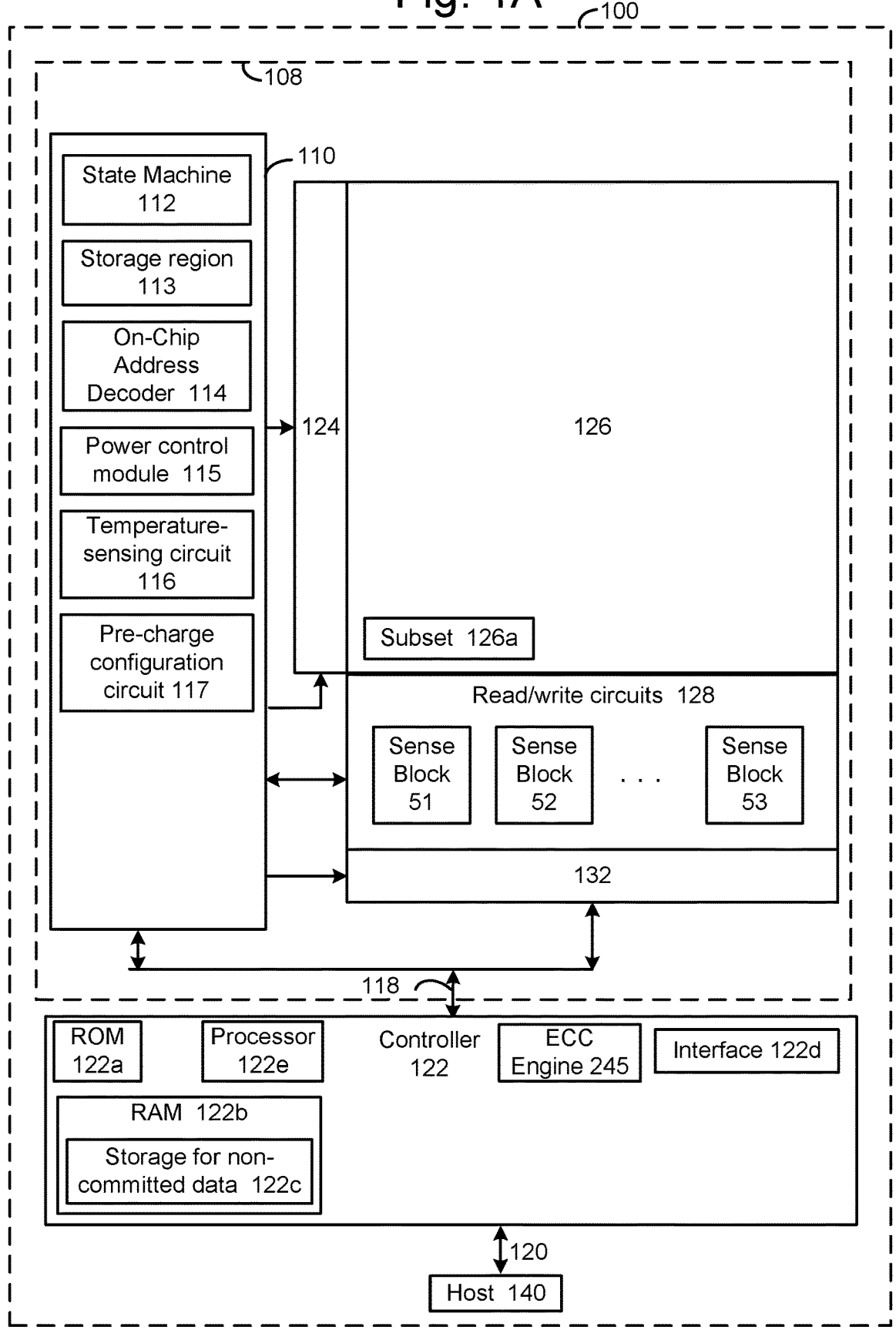

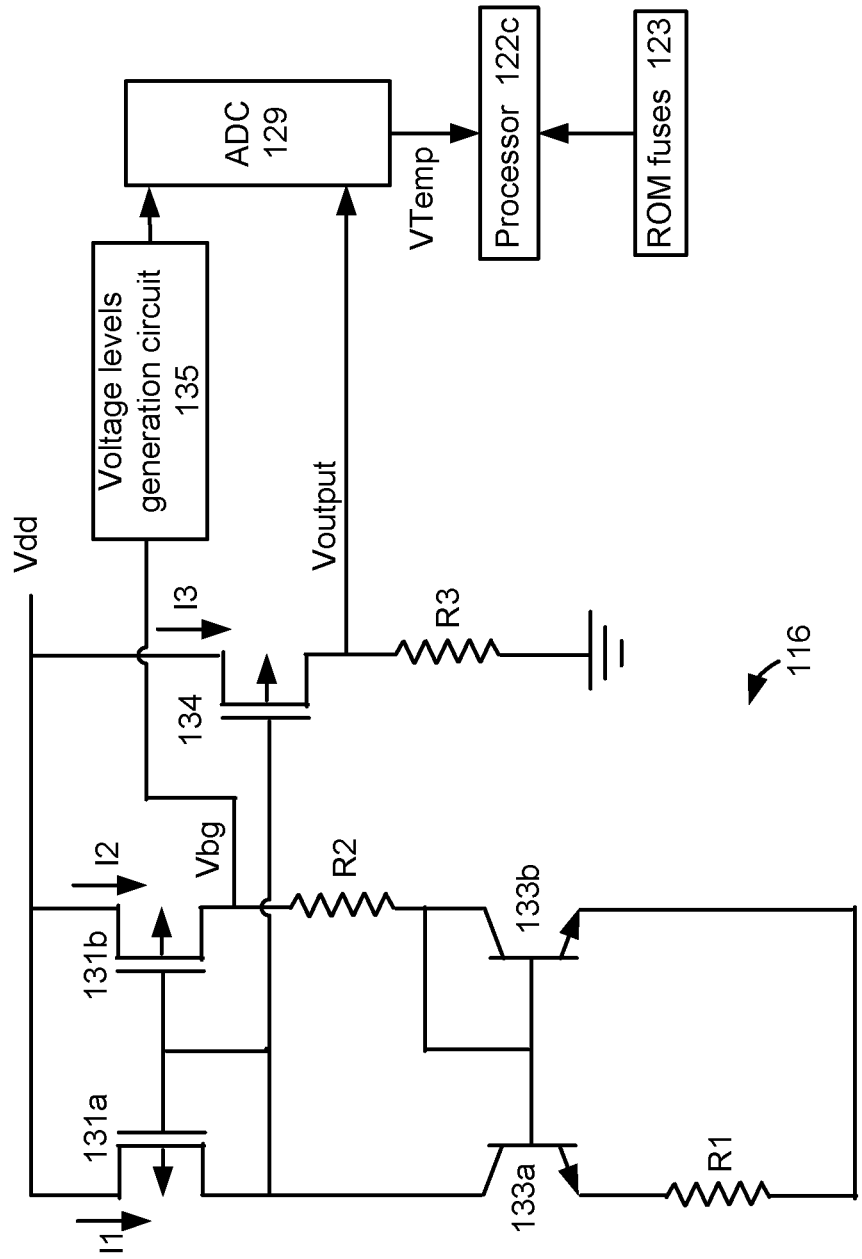

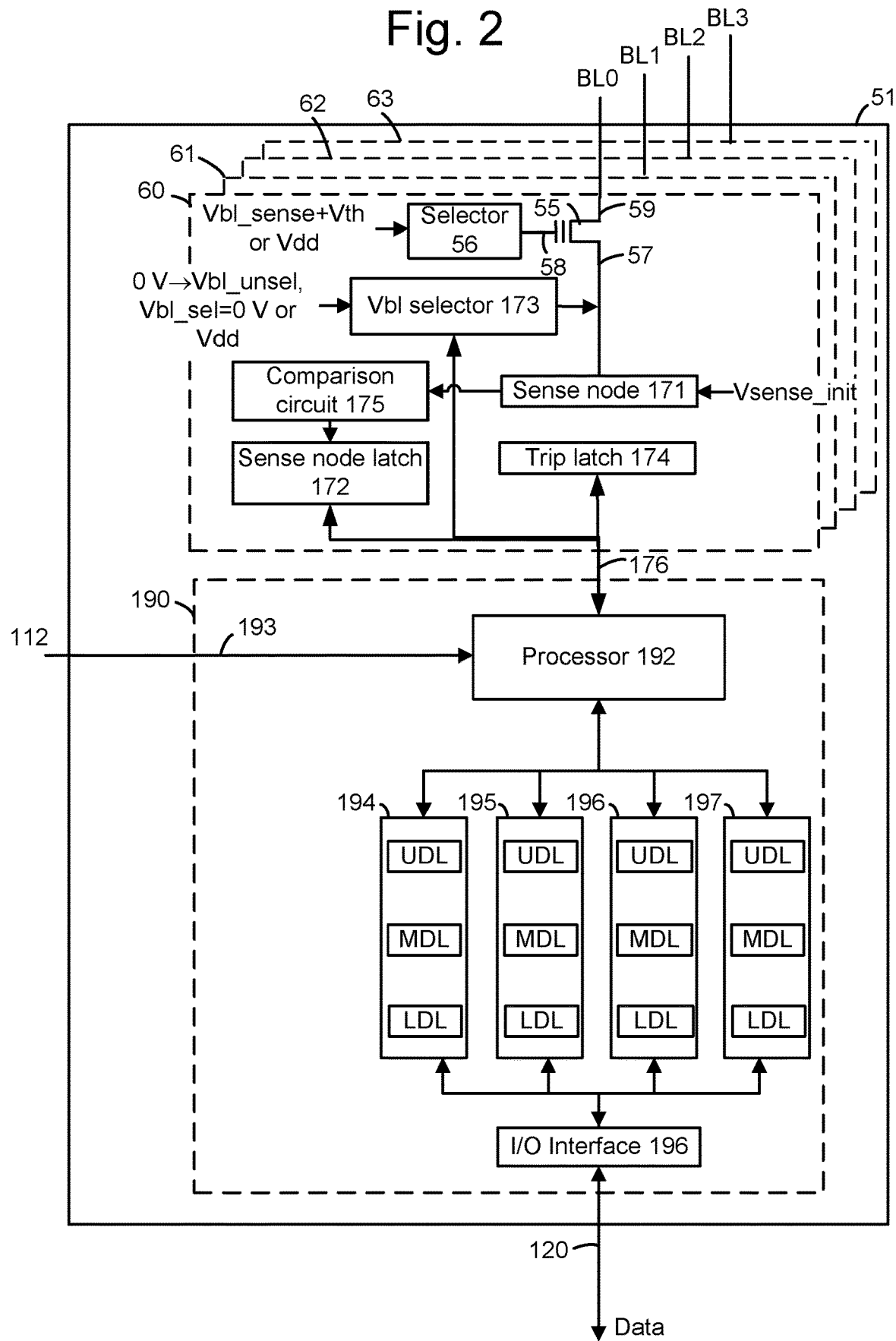

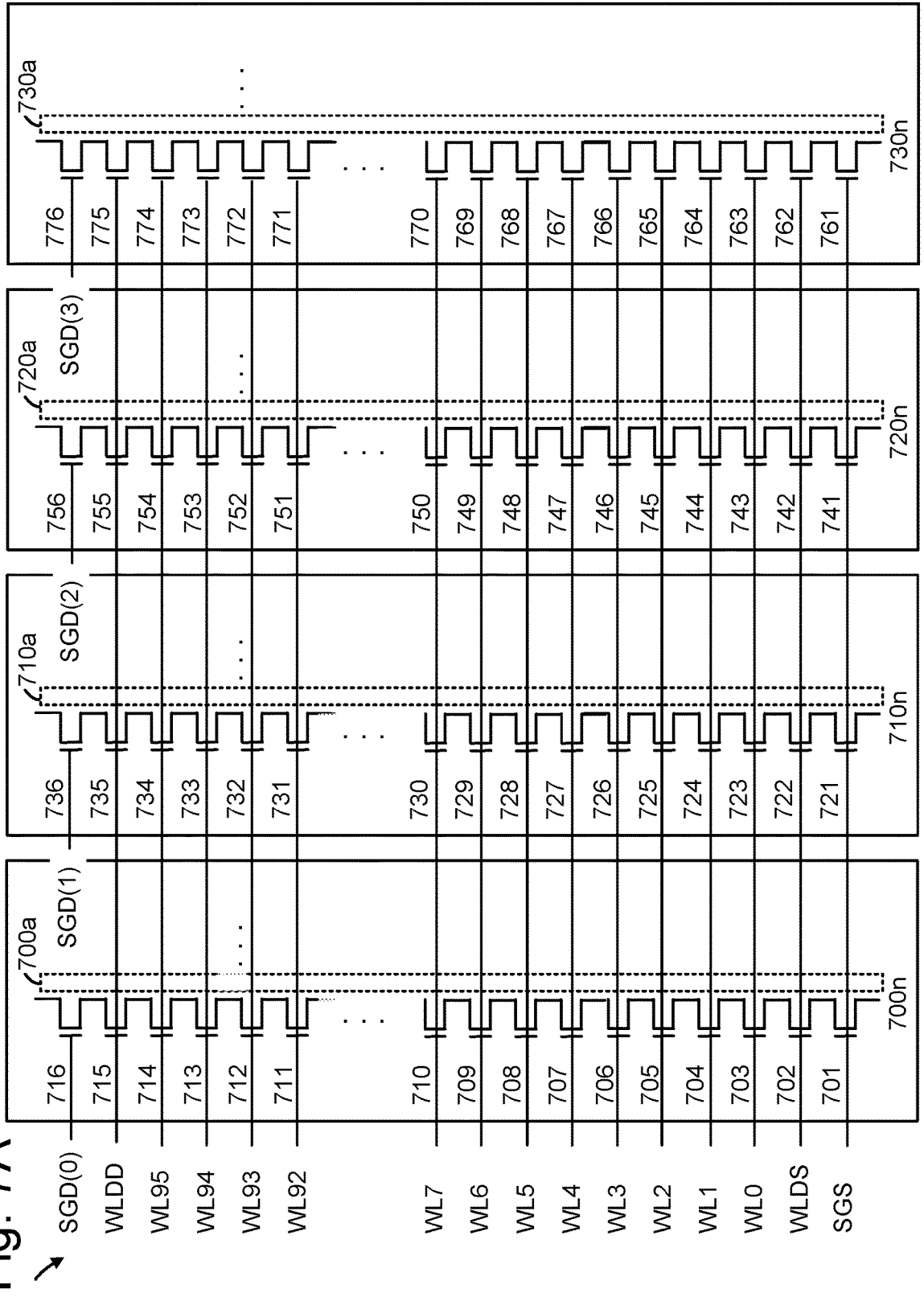

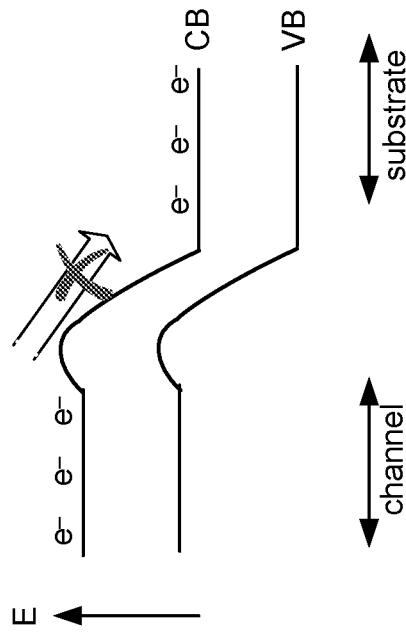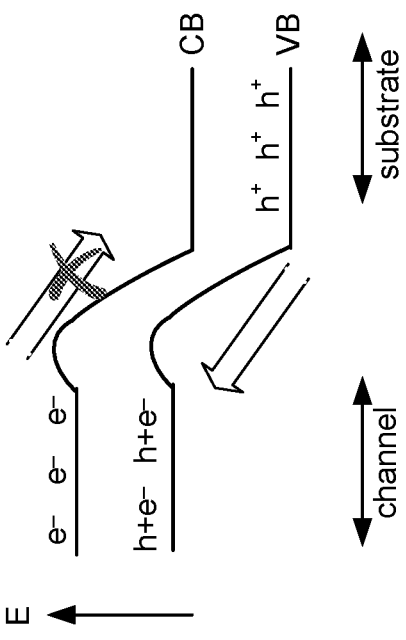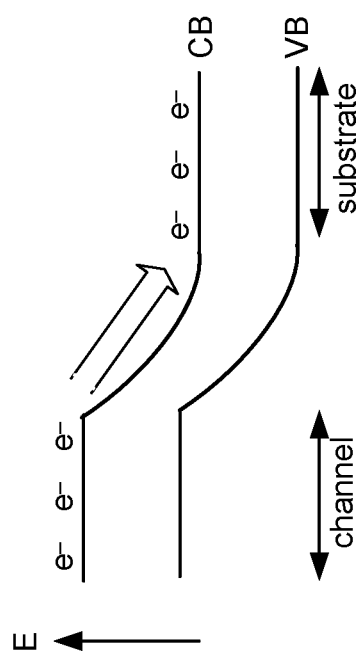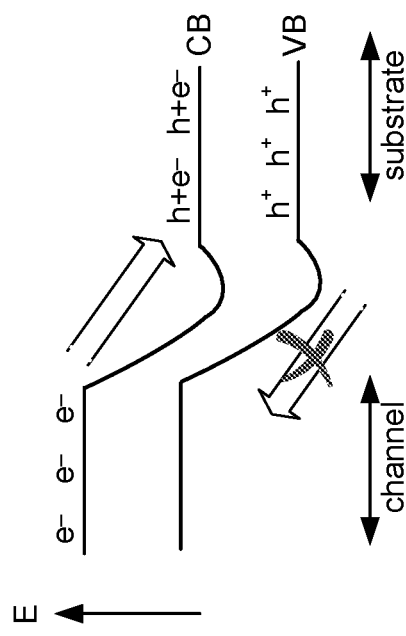

Fig. 9
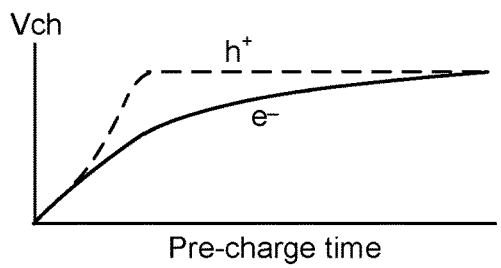
Fig. 10
Pre-charge processes
A. Electron-type pre-charge from drain side:
BL, SGD and drain-side WLs: >0 V
B. Electron-type pre-charge from source side:
SL, P-well, SGS and source-side WLs: >0 V
C. Hole-type pre-charge from source side:
SL, P-well: >0 V
SGS and source-side WLs: 0 V or <0 V
D. B and C separately
E. A and C concurrently
Fig. 11
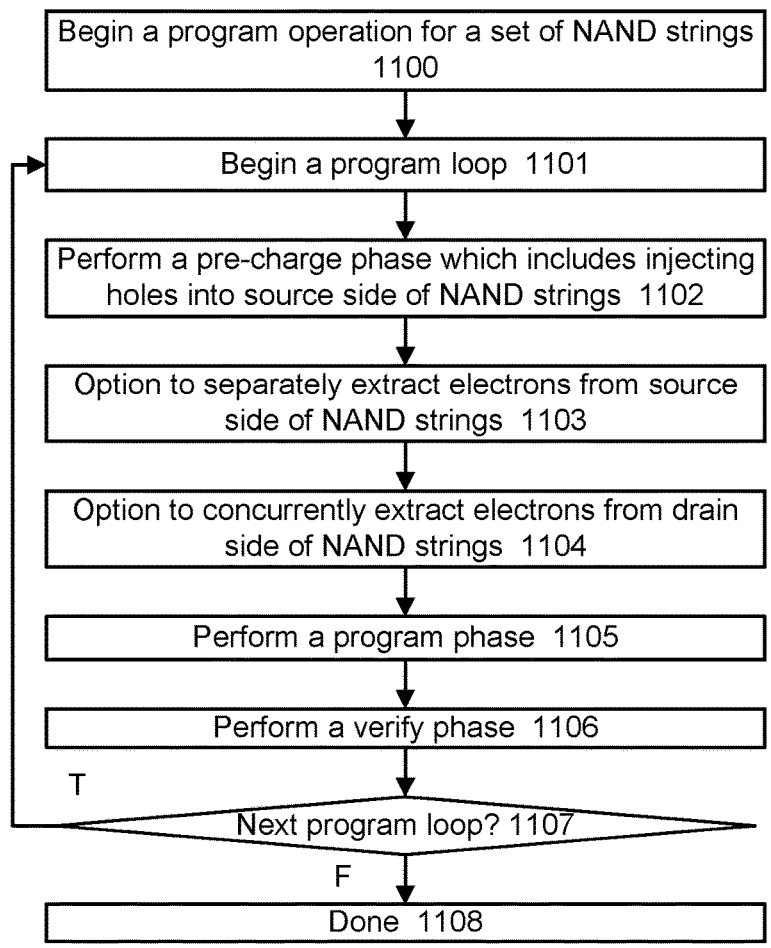

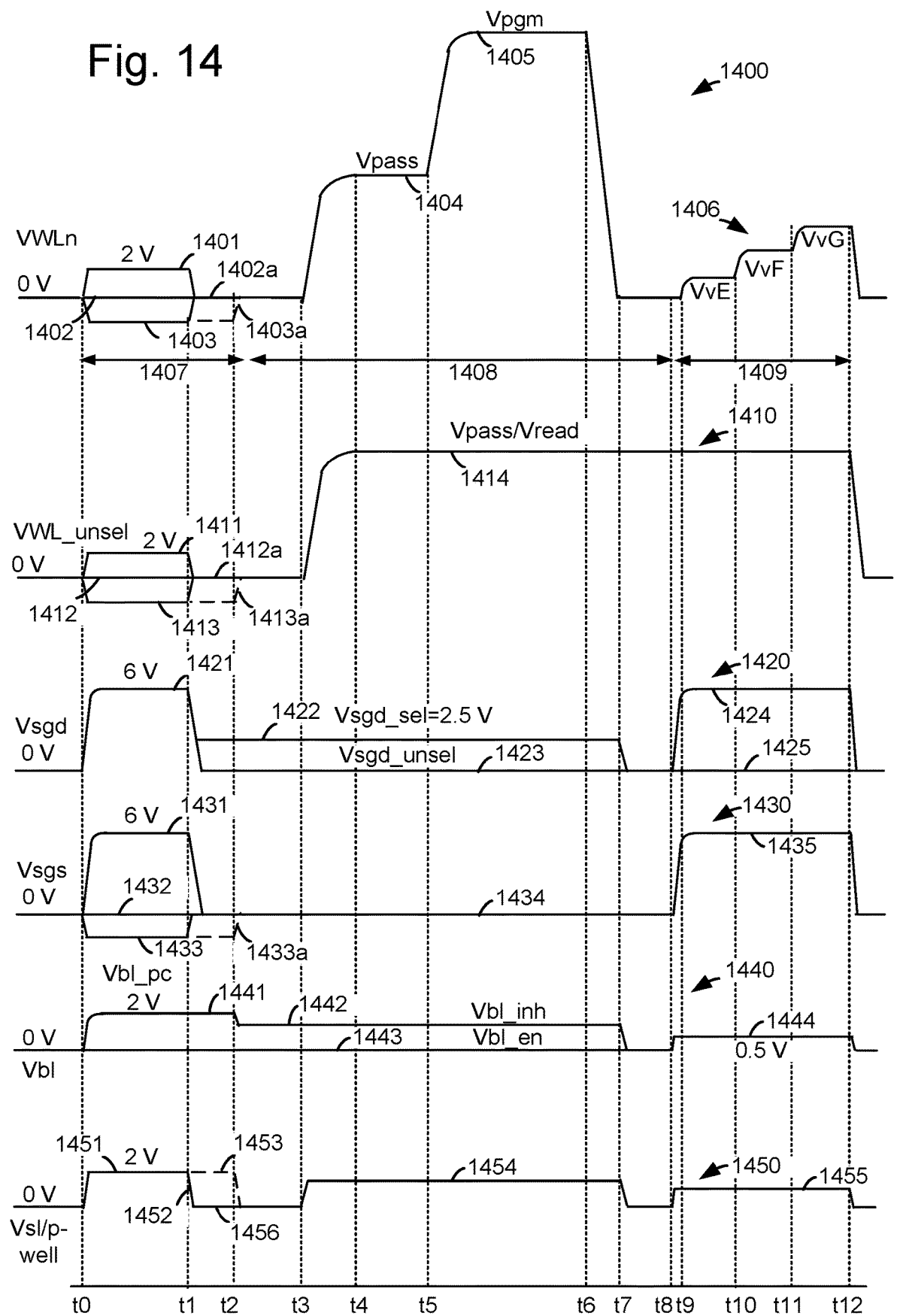

NAND STRING PRE-CHARGE DURING PROGRAMMING BY INJECTING HOLES VIA SUBSTRATE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B depicts an example of the temperature-sensing circuit 116 of FIG. 1A.

FIG. 2 is a block diagram depicting one embodiment of the sense block 51 of FIG. 1A.

FIG. 7A depicts an example view of NAND strings in the block BLK0 which is consistent with FIGS. 4 and 6.

FIG. 8A depicts a band gap diagram for the source end of a NAND string when electrons are extracted from the channel in a source line pre-charge process.

FIG. 8B depicts a band gap diagram for the source end of a NAND string when electrons are no longer extracted from the channel in the source line pre-charge process of FIG. 8A.

FIG. 8C depicts a band gap diagram for the source end of a NAND string when electrons are extracted from the channel in a p-well pre-charge process.

FIG. 8D depicts a band gap diagram for the source end of a NAND string when holes are injected into the channel in a p-well pre-charge process.

FIG. 9 depicts plots of channel voltage versus time for pre-charging using holes and electrons, consistent with FIG. 8A-8D.

FIG. 10 depicts a table of different pre-charge processes.

FIG. 11 depict a flowchart of an example program operation, consistent with the pre-charge modes of FIG. 10.

FIG. 14 depicts example voltage signals for performing a program operation, consistent with FIGS. 11 and 13A.

DETAILED DESCRIPTION

Figure 3:
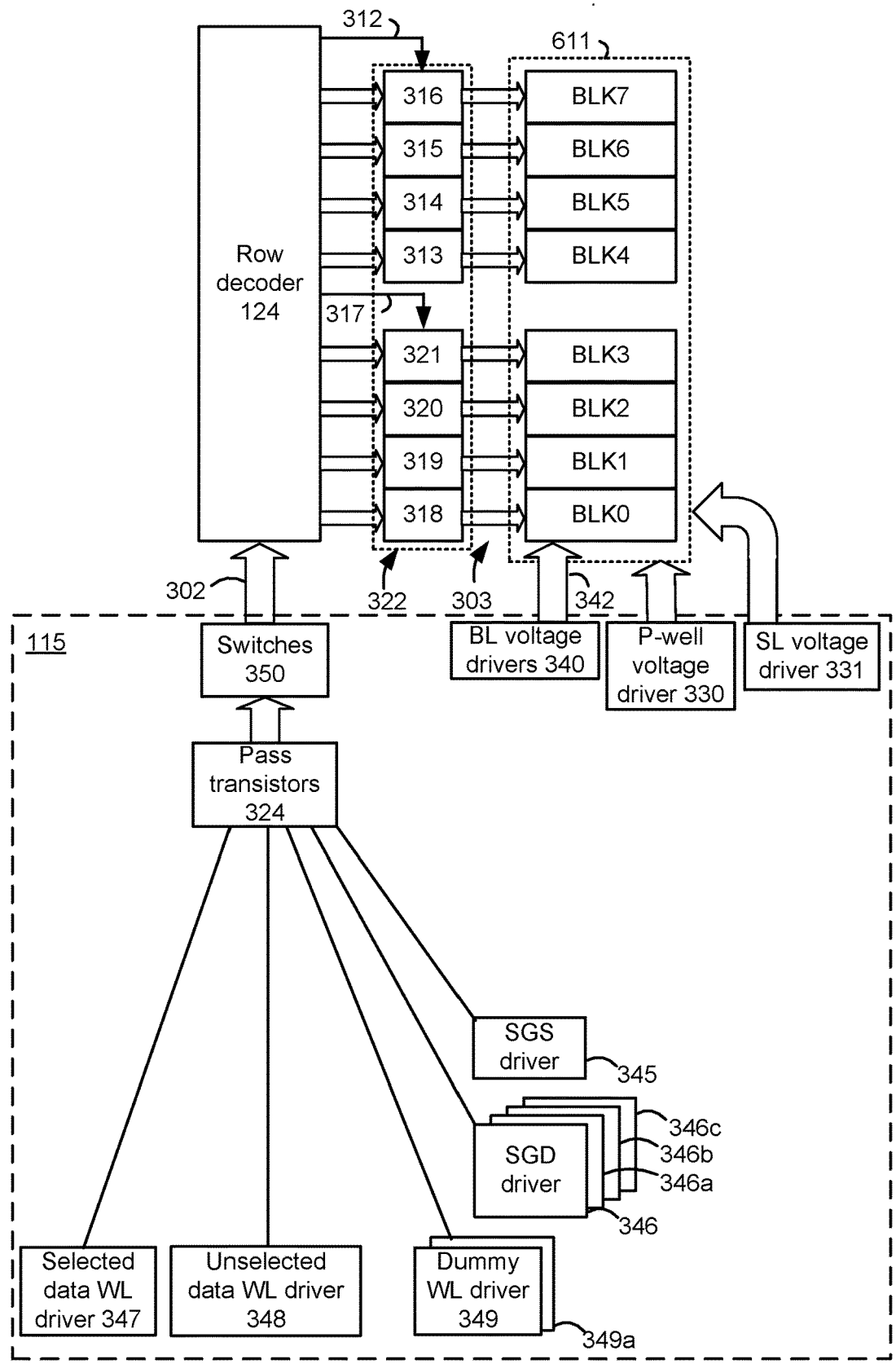
FIG. 3 depicts an example implementation of the power control circuit 115 of FIG. 1A for providing voltages to blocks of memory cells in a plane.

Apparatuses and techniques are described for pre-charging NAND string channels in a pre-charge phase of a program operation. The techniques include injecting holes into a source end of the NAND strings.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

In a 3D memory structure, each NAND string includes a channel which extends vertically in the stack. For example, see the channel 660 in the NAND string 700n in FIG. 6. A source end 700s of the NAND string is connected to the substrate 611 and a drain end 700d of the NAND string is connected to a bit line, BL0.

In a program operation for memory cells in selected NAND strings, a goal is to pre-charge the channels of unselected NAND strings before applying a program pulse to a selected word line. By boosting the channel voltage, the likelihood of program disturb is reduced during the application of the program pulse. One approach to pre-charging the channel is electron-type pre-charging, where electrons are extracted from the channel to increase the channel voltage. This involves applying a positive voltage to the drain and/or source ends of a NAND string while applying a positive voltage to the memory cells and select gate transistors via respective word lines and control lines. By applying a positive voltage to the memory cells and select gate transistors, the associated channel regions become conductive to facilitate the movement of the electrons toward the ends of the NAND strings. However, the electron-type pre-charging requires a long time to recover, thereby reducing performance. Moreover, the amount of channel boosting can be inadequate in some situations, such as in multi-pass programming. For example, in the second pass of a two-pass program operation, the memory cells will have elevated threshold voltages such that it is difficult to make the associated channel regions conductive to facilitate the movement of the electrons toward the ends of the NAND strings.

Techniques provided herein address the above and other issues. In one aspect, a hole-type pre-charge process is used to inject holes into the source end of a NAND string, where a bottom of the NAND string is connected to a p-well of a substrate. The p-well is a region underneath blocks of memory cells. By applying a positive voltage to the p-well and a lower voltage, such as 0 V or a negative voltage, to the SGS transistor and the memory cells, the holes from the p-well are injected into the channel. The lower voltage can be applied at least to a subset 1620 (FIG. 16) of the word lines which is adjacent to the source end of the NAND string.

In another approach, the hole-type pre-charge process and the electron-type pre-charge process are used sequentially at the source ends of the NAND strings in separate time periods. This approach can provide benefits compared to using the hole-type pre-charge process or the electron-type pre-charge process alone at the source ends of the NAND strings. Moreover, the durations of the two processes can be optimized based on factors such as the position of the selected word line in the block.

In another approach, the hole-type pre-charge process is used at the source end of a NAND string while the electron-type pre-charge process is used at the drain end of the NAND string. This hybrid approach helps charge the NAND string from both ends concurrently.

Generally, the pre-charge process can also be optimized based on a risk of program disturb which is a function, e.g., of the position of the selected word line in the block or a sub-block position.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, and a pre-charge configuration circuit 117. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device during the lifetime of the memory device, e.g., every minute. See FIG. 1B for an example implementation of the temperature-sensing circuit. The pre-charge configuration circuit 117 can provide settings for a pre-charge operation, as discussed further below.

The circuits 116 and 117 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, pre-charge configuration circuit 117, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131*a*, 131*b* and 134, bipolar transistors 133*a* and 133*b* and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122*e*. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131*b* and the voltage drop across the resistor R2. The bipolar transistor 133*a* has a larger area (by a factor N) than the transistor 133*b*. The PMOS transistors 131*a* and 131*b* are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1xq, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131*a* and 131*b* and the current through the transistor 134 mirrors the current through the transistors 131*a* and 131*b*.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. See also Vbl in FIG. 13. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one orf a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197, to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, BLK0 to BLK3, and another set of four related blocks, BLK4 to BLK7. The blocks can be in one or more planes. The row decoder 124 of FIG. 1A provides voltages to word lines and select gate control lines of each block via pass transistors 322. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of BLK4-BLK7, respectively. A control gate line 317 is connected to sets of pass transistors 318-321, which in turn are connected to control gate lines of BLK0-BLK3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6. For example, the driver 348 can be used to apply a pre-charge voltage and a pass voltage on the unselected word lines during a program loop of a program operation. See also VWL_unsel in FIG. 13.

The voltage drivers can also include separate SGD drivers for each sub-block. For example, SGD drivers 346, 346a, 346b and 346c can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 612b in the p-well region 611b, e.g., via the conductive path 682. See FIG. 6. In one approach, the p-well region 611b is common to the blocks. A set of bit lines 342 is also shared by the blocks. The source line (SL) voltage driver 331 provides a voltage Vsl to the n+ contact 612c in the p-well region 611b, e.g., via the local interconnect 651.

Bit line voltage drivers 340 include voltage sources which provide voltages to the bit lines 342, such as a program-inhibit voltage signal, Vbl_inh, a program-enable voltage signal, Vbl_en, a pre-charge voltage signal, Vbl_pc (FIG. 14), and a voltage for sensing, Vbl_sense. The program-inhibit voltage signal has a magnitude of 1-2 V, for example, to inhibit programming in a NAND string. The program-enable voltage signal has a magnitude of 0 V, for example, to allow programming to occur for a selected memory cell in a NAND string. The pre-charge voltage signal has a magnitude of 1-2 V, for example, to pre-charge a channel of a NAND string. The voltage for sensing can have a magnitude of 0.5 V, for example, to facilitate sensing for a selected memory cell in a NAND string during a read operation or a verify test.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
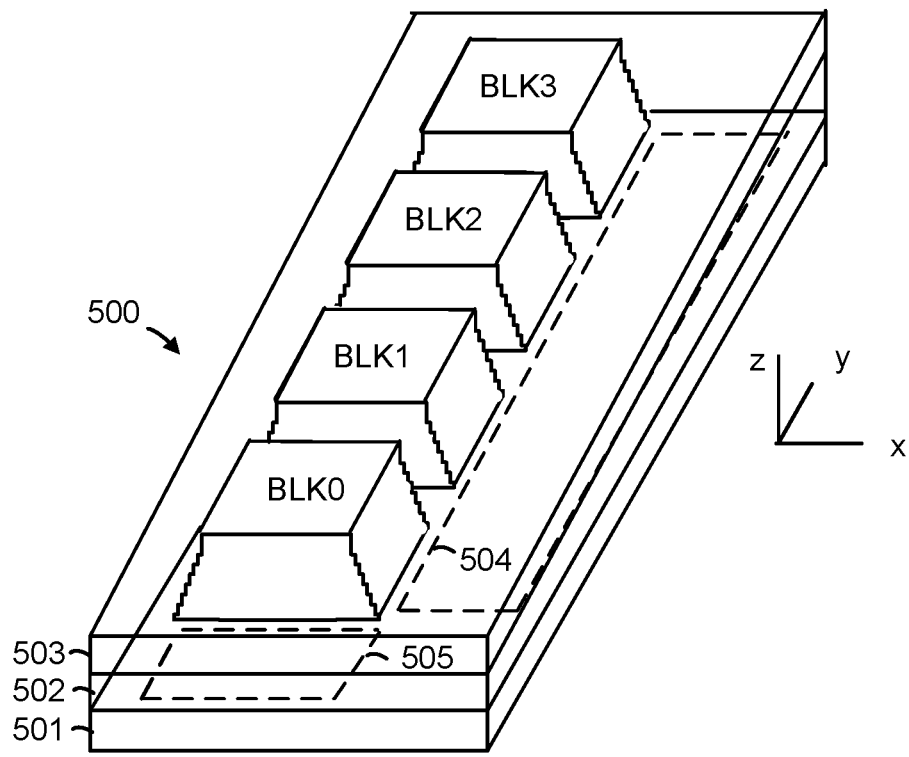
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1A. On the substrate are example blocks BLK0-BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
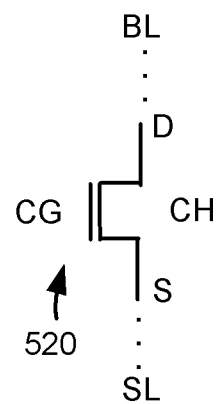
FIG. 5 depicts an example transistor 520 in the memory structure 126 of FIG. 1A.
Figure 6:
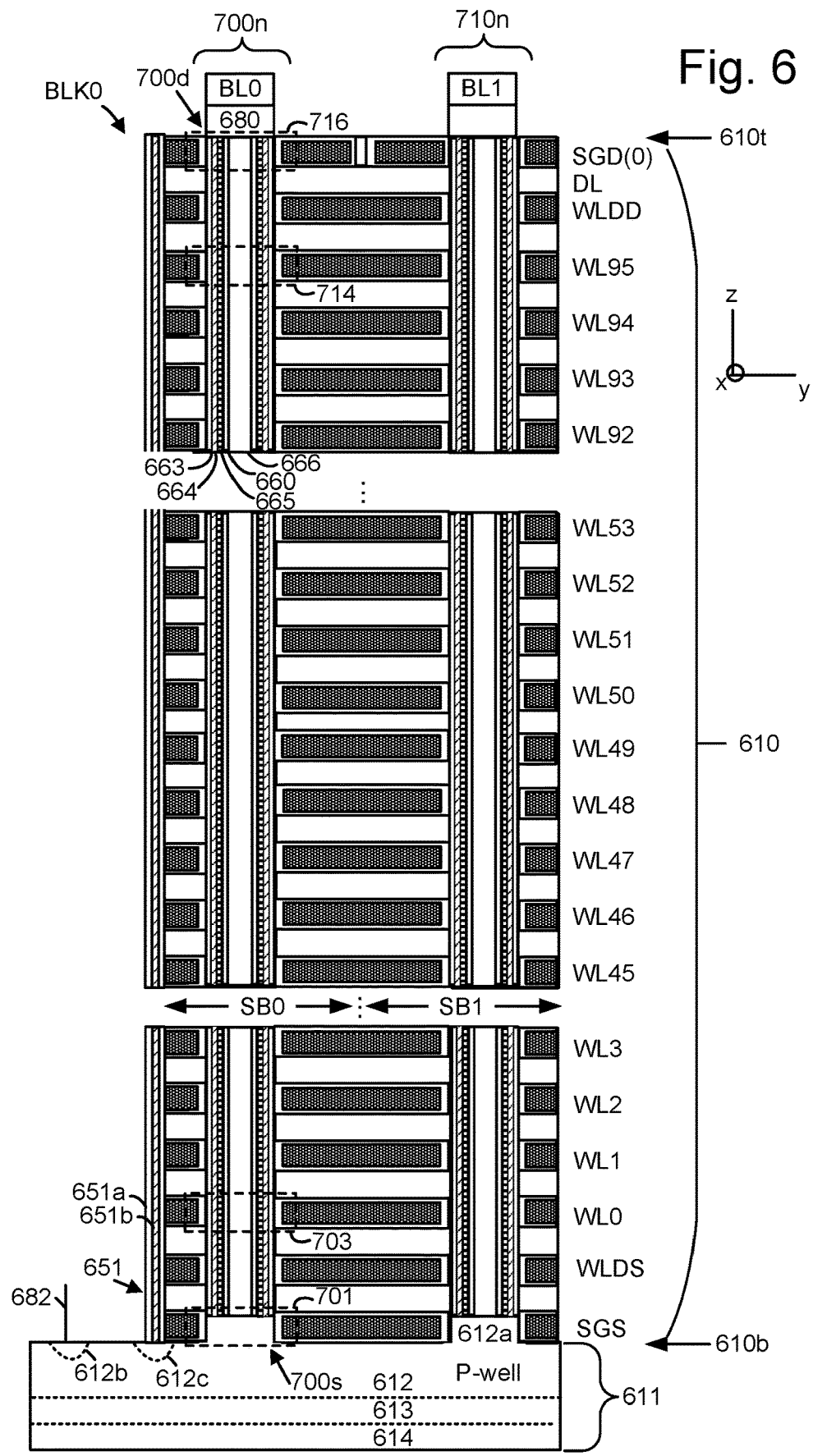
FIG. 6 depicts an example cross-sectional view of a portion of the block BLK0 of FIG. 4, including NAND strings 700n and 710n.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6 depicts an example cross-sectional view of a portion of the block BLK0 of FIG. 4, including NAND strings 700*n* and 710*n*. In this example, the NAND strings 700*n* and 710*n* are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 610*t* and bottom 610*b* of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride ($Si_3N_4$) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611*a* (see also FIG. 3) connected to the source ends of the NAND strings. The p-well region may comprise epitaxial regions 612 which extend upward adjacent to the source-side select gate transistors. The p-well region can include an n+ contact 612*c* connected to a local interconnect 651 for receiving a source line voltage, and a p+ contact 612*b* connected to a conductive path 682 for receiving a p-well voltage. The local interconnect 651 can comprise a conductive material 651*b* such as metal surrounded by insulating material 651*a* to prevent conduction with the metal of the adjacent word lines. The p-well region is formed in an n-well 613, which in turn is formed in a p-type semiconductor region 614 of the substrate, in one possible implementation.

The NAND string 700*n* has a source end 700*s* at a bottom 610*b* of the stack 610, connected to the p-well. The NAND string 700*n* also has a drain end 700*d* at a top 610*t* of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 12. During an erase operation, the electrons return to the channel.

FIG. 7A depicts an example view of NAND strings in the block BLK0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source end word line and end at WL95, the drain end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

After a block of memory cells is erased in an erase operation, programming can occur in which the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks. For example, a portion of the memory cells of WLn in SB0 are first programmed, followed by a portion of the memory cells of WLn in SB1, a portion of the memory cells of WLn in SB2 and then a portion of the memory cells of WLn in SB3. WLn refers to a word line selected for programming A programming operation may include one or more sets of increasing program voltages or pulses which are applied to a word line in respective program loops, also referred to as program-verify iterations, such as depicted in FIG. 13A. Verify tests may be performed after each program voltage to determine whether the memory cells have completed programming. The programming is complete when the memory cells are in an assigned data state as represented by a threshold voltage (Vth) distribution, such as in FIG. 12.

Figure 7B:
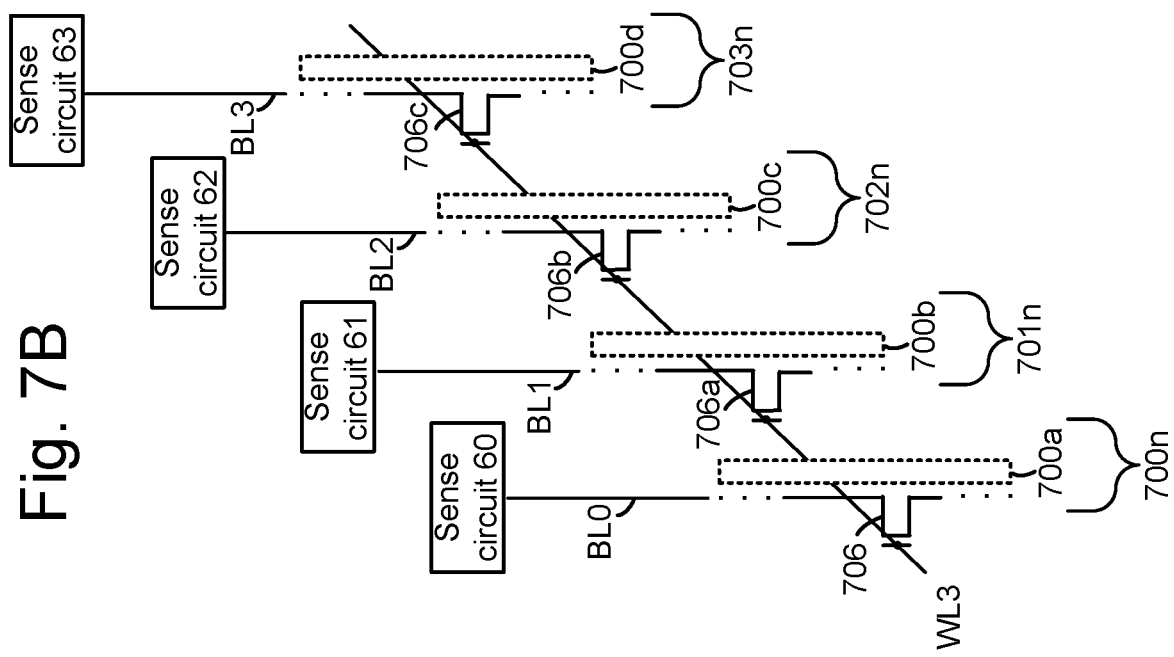
FIG. 7B depicts an example view of memory cells connected to WL3 in the sub-block SB0 of FIG. 7A, with respective NAND strings, bit lines and sense circuits.

FIG. 7B depicts an example view of memory cells connected to WL3 in the sub-block SB0 of FIG. 7A, with respective NAND strings, bit lines and sense circuits. The memory cell 706 and channel 700a of the NAND string 700n in SB0 of FIG. 7A are depicted, along with a respective bit line BL0. SB0 also includes memory cells 706a, 706b and 706c in NAND strings 701n, 702n and 703n, respectively, which have channels 700b, 700c and 700d, respectively, and which are connected to bit lines BL1, BL2 and BL3, respectively. The bit lines BL0-BL3 are connected to the sense circuits 60-63, respectively, of FIG. 2.

In a program loop, the memory cells 706 and 706a could be examples of selected and unselected memory cells, respectively, in which case the NAND strings 700n and 701n are examples of selected and unselected NAND strings, respectively, and the bit lines BL0 and BL1 are examples of selected and unselected bit lines, respectively.

FIG. 8A depicts a band gap diagram for the source end of a NAND string when electrons are extracted from the channel in a source line pre-charge process. In FIG. 8A-8D, the vertical direction denotes energy for a conduction band (CB) and a valence band (VB), and the horizontal direction denotes a distance at the source end of a NAND string, ranging from the source end of the channel to the substrate. Further, electrons are denoted by "e−," holes are denoted by "h−" and the recombination of electrons with holes is denoted by "h+e−."

In FIG. 8A, a high bias is applied to the SGS transistors and to the source line, resulting in the electrons being extracted from the channel to the substrate. In particular, when a high bias is applied to the source line, which includes the n+ contact 612c in the p-well, an n-type inversion layer is formed in the substrate between the n+ contact and the channel which allows the extraction of the electrons. With fewer electrons in the channel, the voltage of the channel increases. This example of a pre-charge involves movement of charge carriers in one direction.

FIG. 8B depicts a band gap diagram for the source end of a NAND string when electrons are no longer extracted from the channel in the source line pre-charge process of FIG. 8A. When a low bias is applied to the SGS transistors and the high bias remains on the source line, an energy barrier is created which stops the extraction of the electrons from the channel.

FIG. 8C depicts a band gap diagram for the source end of a NAND string when electrons are extracted from the channel in a p-well pre-charge process. A p-well pre-charge can include two pre-charge mechanisms, e.g., electron extraction and hole injection. In this example, when a high bias is applied to the p-well, e.g., via the p+ contact 612b, and to the SGS transistors, electrons are extracted from the channel to the p-well to recombine with holes in the p-well, as denoted by "h+e−." Additionally, holes in the p-well are prevented from being injected into the channel.

FIG. 8D depicts a band gap diagram for the source end of a NAND string when holes are injected into the channel in a p-well pre-charge process. In this example, when a low bias is applied to the SGS transistors and the high bias remains on the p-well, holes are injected into the channel where they recombine with electrons, as denoted by "h+e−," thereby increasing the channel voltage. Additionally, the extraction of electrons from the channel to the p-well is prevented.

FIG. 9 depicts plots of channel voltage versus time for pre-charging using holes and electrons, consistent with FIG. 8A-8D. The solid line plot denotes a rate of pre-charge which occurs using the electron-type pre-charging, and the dashed line plot denotes a rate of pre-charge which occurs using the faster hole-type pre-charging. With electron-type pre-charging, for an electron to conduct in the channel, the following condition must be met: Vpch-Vch>Vt_e, or Vpch-Vt_e>Vch, where Vpch represents the word line and control line voltage for the memory cells and select gate transistors, respectively, Vch denotes the channel voltage and Vt_e denotes the electron voltage. In a pre-charge operation, as the channel voltage increases, the channel becomes less conductive, so that it is more difficult to charge up. The maximum Vch is the smaller of Vddsa or Vpch-Vt_e, where Vddsa is the voltage of the power supply of the memory chip.

With hole-type pre-charging, for a hole to conduct in the channel, the following condition must be met: Vpch-Vch<Vt_h, or Vpch-Vt_h<Vch, where Vt_h denotes the hole voltage. In a pre-charge operation, as the channel voltage increases, the channel becomes more conductive, so that it is easier to charge up. The pre-charge process is therefore faster and more efficient. The maximum Vch is Vddsa, as long as Vpch-Vt_h<Vddsa. It is easier to conduct holes with either a high Vt_h, which occurs in the channel region of a memory cell with a high programmed state, or when Vpch<0 V. If a negative Vpch is available on the chip, a hole-type pre-charge at the source end of a NAND string (process C in FIG. 10) can be sufficient to pre-charge the entire NAND string channel.

If a negative Vpch is not available on the chip, and the minimum value of Vpch is 0 V, two approaches are possible. In a first approach, a reverse (or top to bottom) word line programming order is used. This involves programming the word lines starting from the top of the stack and proceeding one word line at a time to the bottom of the stack or to an intermediate level in the stack which is between the top and bottom of the stack. The electron-type pre-charge can be perform first, followed by the hole-type pre-charge, consistent with process D in FIG. 10.

In a second approach, a normal (or bottom to top) word line programming order is used. This involves programming the word lines starting from the bottom of the stack and proceeding one word line at a time to the top of the stack or to an intermediate level in the stack. The electron-type pre-charge can be perform at the drain end of the NAND string while the hole-type pre-charge is performed at the source end of the NAND string, consistent with process E in FIG. 10.

FIG. 10 depicts a table of different pre-charge processes, labeled from A-E. Process A involves an electron-type pre-charge from the drain side, where the voltages of the bit line, SGS line and drain-side word lines are greater than 0 V. Process B involves an electron-type pre-charge from the source side, where the voltages of the source line, p-well, SGS line and source-side word lines is greater than 0 V. Process C involves a hole-type pre-charge from the source side, where the voltages of the source line and p-well are greater than 0 V, and the voltages of the SGS line and source-side word lines are 0 V or less than 0 V. Process D involves processes B and C separately in time, where it is more efficient for process C to follow process B. Process D is particularly suitable when a top to bottom word line programming order is used. Process E involves processes A and C concurrently. Process E is particularly suitable when a bottom to top word line programming order is used.

FIG. 11 depict a flowchart of an example program operation, consistent with the pre-charge modes of FIG. 10. Step 1100 begins a program operation for a set of NAND strings. The program operation involves memory cells in the NAND strings which are connected to a selected word line among a plurality of word lines. Step 1101 begins a program loop. Step 1102 includes performing a pre-charge phase 1407 (FIG. 14) of the program operation which includes injecting holes into the source side of the NAND strings. Note that this injection can occur for all NAND strings, including selected and unselected NAND strings, in a block. For the selected NAND strings, the grounding of the bit line during the subsequent program pulse removes the channel boosting.

In an example implementation of step 1102, to inject the holes into the channel at the source end of the NAND string, a control circuit is configured to bias a source-side subset 1620 of the plurality of word lines at the source end 700s of the NAND string 700n with a respective voltage of no more than 0 V (e.g., 0 V or <0 V) concurrent with the biasing of the source-side select gate control line SGS with the respective voltage of no more than 0 V, the n-type contact 612c with the respective positive voltage and the p+ contact 612b with the respective positive voltage.

Step 1103 denotes an option for the pre-charge phase which includes separately extracting electrons for the source side of the NAND string, consistent with the process D of FIG. 10. The hole injection of step 1102 may occur in a first time period and the electron extraction of step 1103 may occur in a separate second time period. The second time period may be t1-t2 in FIG. 14, which is after the first time period of t041.

In an example implementation of step 1103, before the injecting of the holes into the channel at the source end of the NAND string, the control circuit is configured to extract electrons from the channel at the source end of the NAND string, the extracting of the electrons from the channel at the source end of the NAND string comprises concurrently biasing a source-side subset of the plurality of word lines at the source end of the NAND string with a respective positive voltage, the source-side select gate control line with a respective positive voltage, the n-type contact with a respective positive voltage and the p+ contact with a respective positive voltage.

Step 1104 denotes another option for the pre-charge phase which includes concurrently extracting electrons from the drain side of the NAND strings, consistent with the process E of FIG. 10. Both of the options of steps 1102 and 1103 could be used as well.

In an example implementation of step 1104, to pre-charge the channel, during the injecting of the holes into the channel at the source end of the NAND string, the control circuit is configured to extract electrons from the channel at the drain end of the NAND string, the extracting electrons from the channel at the drain end of the NAND string comprises concurrently biasing a drain-side subset 1600 of the plurality of word lines at the drain end 700d of the NAND string with a respective positive voltage, the drain-side select gate control line SGD with a respective positive voltage and the drain end with a respective positive voltage.

Step 1105 includes performing a program phase 1408 (FIG. 14) of the program operation, including applying a program pulse to the selected word line. The program pulse can be have an initial pass voltage, Vpass, and then a peak level, Vpgm.

Step 1106 includes performing a verify phase 1409 (FIG. 14) of the program operation, including applying a verify signal 1406 to the selected word line and sensing the selected memory cells during the different verify voltages of the verify signal. For example, the verify signals can be consistent with FIGS. 12, 13A and 13B.

A decision step 1107 determines if there is a next program loop in the program operation. If the decision step is true, a next program loop begins at step 1101. If the decision step is false, the program operation is done at step 1108.

Figure 12:
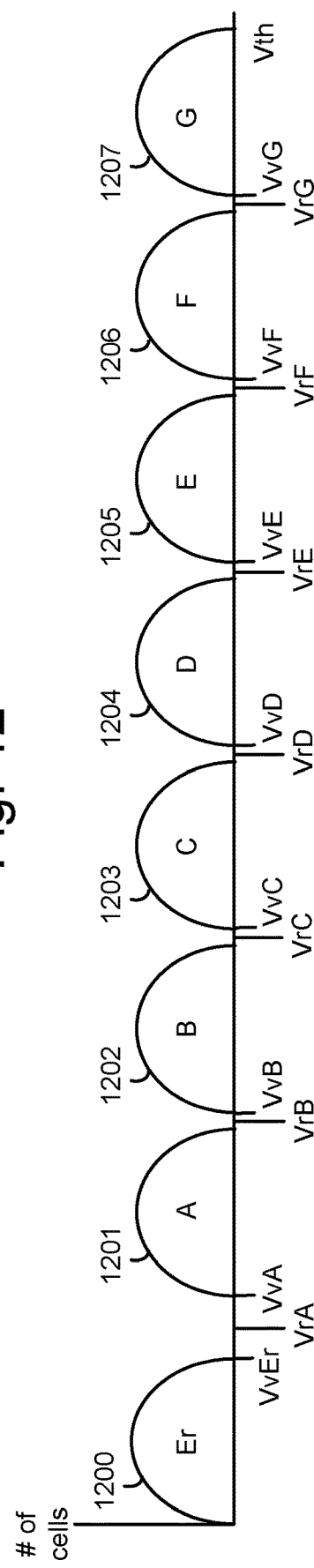
FIG. 12 depicts example Vth distributions of a set of memory cells with three bits per cell and eight data states.
Figure 13A:
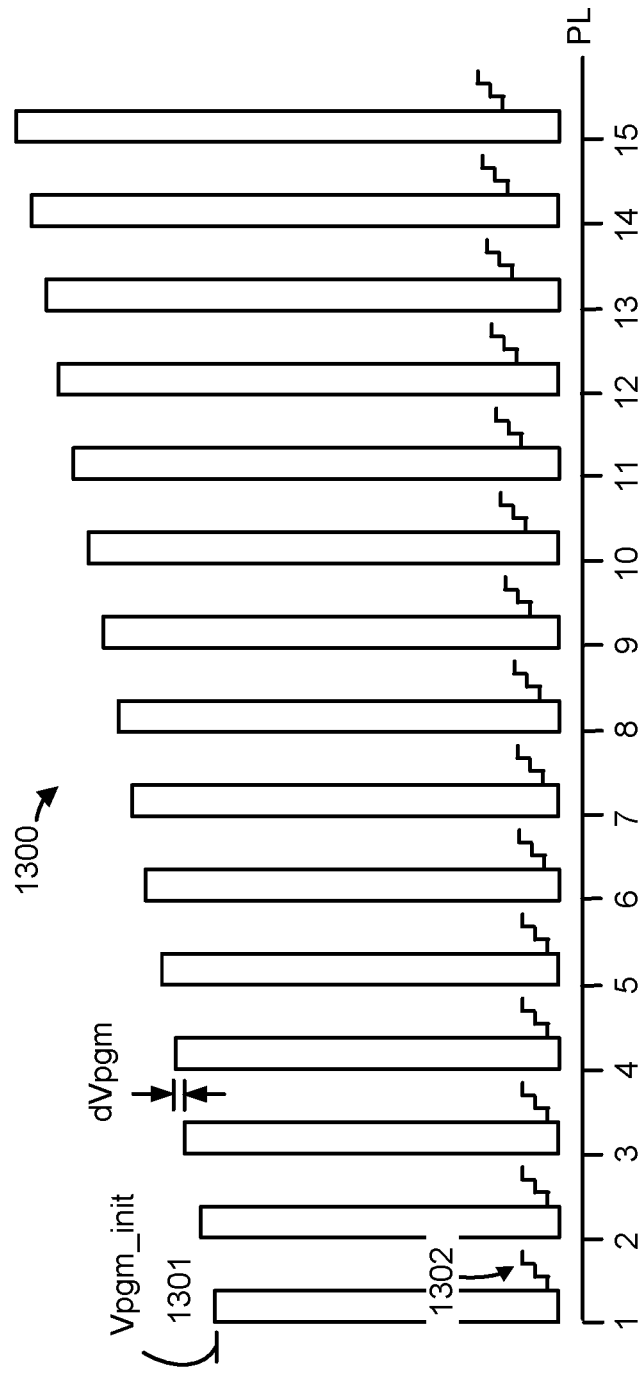
FIG. 13A depicts an example voltage signal used in a program operation, consistent with FIG. 11.

FIG. 12 depicts example Vth distributions of a set of memory cells with three bits per cell and eight data states. The vertical axis depicts a number of memory cells on a logarithmic scale, and the horizontal axis depicts a Vth of the memory cells on a linear scale. The techniques provided herein can be used with both single level cells and multi-level cells.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

In one approach, at a start of a program operation, the memory cells are all initially in the erased (Er) state, as represented by the Vth distribution 1200. After the program operation is successfully completed, the memory cells assigned to the A-G states are represented by the Vth distributions 1201-1207 which have associated verify voltages of VvA-VvG, respectively. Read voltages VrA-VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight-state example.

Figure 13B:
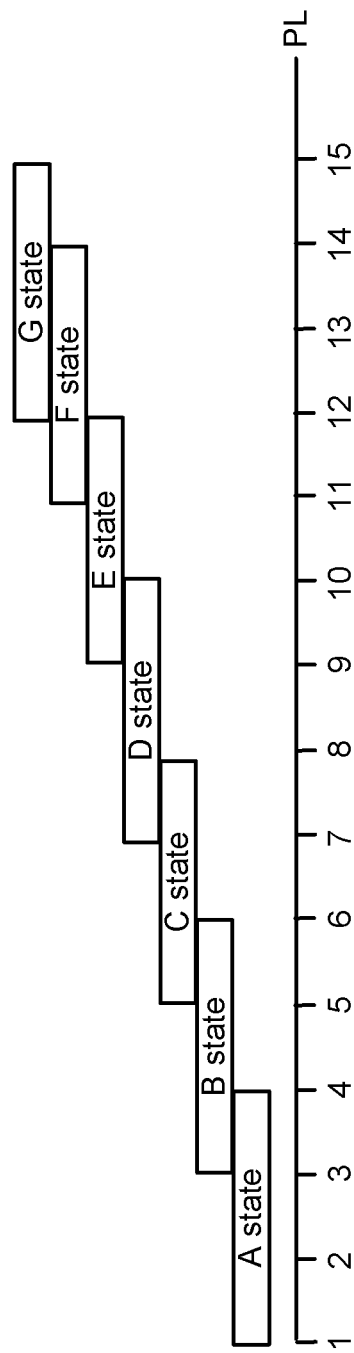
FIG. 13B depicts an example of verify voltages used in the different program loops of FIG. 13A.

FIG. 13A depicts an example voltage signal used in a program operation, consistent with FIG. 11. The voltage signal 1300 includes a set of program pulses, including an initial program pulse 1301, which are applied to a word line selected for programming. The initial program pulse has a voltage Vpgm_init, and dVpgm denotes the step size between successive program pulses. A single program pass is used having fifteen program loops, as an example. The verify signals in each program loop, including example verify signals 1302, can encompass lower assigned data states, then midrange assigned data states and then higher assigned data states as the program operations proceeds, as depicted in FIG. 13B. See also the signals of FIG. 14 for example details of a program loop.

The example verify signals depict three verify voltages as a simplification. A verify signal is applied to a selected word line during a program loop after the application of a program pulse to the selected word line. Memory cells are sensed during the application of the verify signal in a verify test to judge their programming progress. A verify signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

FIG. 13B depicts an example of verify voltages used in the different program loops of FIG. 13A. The horizontal bars are time-aligned with the program loop axis of FIG. 13A. The bars overlap in some program loops, indicating that verify operations can be performed for multiple data states in the program loop. With eight data states, the bars indicate that verify voltages for the A, B, C, D, E, F and G states are applied in program loops 1-4, 3-6, 5-8, 7-10, 9-12, 11-14 and 12-15, respectively.

In one approach, the program loops in which the verify tests are performed are predetermined, before the program operation. In another approach, the program loops in which the verify tests are performed are determined adaptively as the programming progresses. For example, the B state verify tests may begin in a next program loop after a specified portion of the A state memory cells have passed their verify test.

FIG. 14 depicts example voltage signals for performing a program operation, consistent with FIGS. 11 and 13A. The vertical dimension denotes voltage and the horizontal dimension denotes time, with time points t0412. The period of time depicted corresponds to one program loop and includes a pre-charge phase 1407 (t0-t2), a program phase 1408 (t2-t8) and a verify phase 1409 (t9-t12). Voltage signals 1400, 1410, 1420, 1430, 1440 and 1450 depict VWLn, VWL_unsel, Vsgd, Vsgs, Vbl and Vsl/Vp-well, respectively. VWL_unsel can include data and dummy word lines.

As mentioned, the pre-charge phase is used to charge up the channels of the NAND string using various processes such as depicted in FIG. 10. VWLn is the voltage applied to the selected word line. In the pre-charge phase, three voltages are depicted for VWLn. Plot 1401 depicts a positive voltage such as 1-2 V, plot 1402 depicts 0 V and plot 1403 depicts a negative voltage such as −1 to −2 V. A plot 1403*a* depicts an option for the pre-charge process D in FIG. 10. In the program phase, VWLn is increased from 0 V (plot

1402*a*) to a pass voltage, Vpass (plot 1404), at t3 and then to a peak level, Vpgm (plot 1405), at t5. VWLn is then decreased back to 0V at t6 before the verify phase 1409. In the verify phase, a verify signal 1406 is applied to the selected word line, and the selected memory cells are sensed during the different verify voltages of the verify signal. In this example, the verify voltages are VvE, VvF and VvG, consistent with program loop 12 in FIG. 13B.

VWL_unsel represents the voltage applied to the unselected word lines. In some cases, different voltages can be applied to different groups of unselected word lines. Plot 1411 depicts a positive voltage such as 1-2 V, plot 1412 depicts 0 V and plot 1413 depicts a negative voltage such as −1 to −2 V. In the program phase, VWL_unsel is increased from 0 V (plot 1412*a*) to Vpass (plot 1414), then decreased back to 0 V at t12 at the end of the verify phase 1409. A plot 1413*a* depicts an option for the pre-charge process D in FIG. 10.

Vsgd represents the voltage applied to the SGD transistors, also referred to as the drain-side select gate transistors, via a SGD control line. Plot 1421 depicts a positive voltage such as 4-6 V for all SGD transistors in a block. This allows Vbl to be passed to the channels. For SGD transistors of selected NAND strings, plot 1422 depicts Vsgd_sel, e.g., 2.5 V during the program phase. Vsgd_sel is high enough to provide the associated SGD transistors in a conductive state for the selected NAND strings, which receive a program-enable voltage of Vbl_en=0 V. For SGD transistors of unselected NAND strings, plot 1423 depicts Vsgd_unsel, e.g., 0 V during the program phase. This provides the associated SGD transistors in a non-conductive state for the unselected NAND strings. This allows the associated channels to be boosted by capacitive coupling when VWLn and VWL_unsel are ramped up from 0 V to Vpass. This is in addition to the boosting from the pre-charge phase. A plot 1424 shows Vsgd_sel at an elevated level such as 4-6 V during the verify phase to allow sensing to occur in the associated NAND strings. A plot 1425 shows Vsgd_unsel at 0 V during the verify phase since sensing does not occur in the associated NAND strings.

Vsgs represents the voltage applied to the SGS transistors, also referred to as the source-side select gate transistors, via a SGS control line. In one approach, all SGS transistors in a block are connected and receive the same voltage. In the pre-charge phase, plot 1431 depicts a positive voltage such as 4-6 V for all SGS transistors in a block. This allows Vsl or Vp-well to be passed to the channels, such as for source-side electron-type pre-charging. Plot 1432 depicts 0 V and plot 1433 depicts a negative voltage such as −1 to −2 V. These values are appropriate for source-side hole-type pre-charging. A plot 1433*a* depicts an option for the pre-charge process D in FIG. 10.

Plot 1434 depicts Vsgs=0 V during the program phase. A plot 1435 shows Vsgd at an elevated level such as 4-6 V during the verify phase to allow sensing to occur in the selected NAND strings.

Vbl represents the bit line voltage, which can be set separately for selected and unselected NAND strings. In the pre-charge phase, plot 1441 depicts a positive pre-charge voltage, Vbl_pc, such as 2 V for selected NAND strings when the drain-side electron-type pre-charging is used. Plot 1443 depicts 0 V for bit lines connected to unselected NAND strings. In the program phase, a plot 1442 depicts a program-inhibit voltage Vbl_inh=1.5 V, for example, for the unselected NAND strings, and a plot 1443 depicts a program-enable voltage Vbl_en=0 V, for example, for the selected NAND strings. A plot 1444 shows Vbl=0.5 V, for example, during the verify phase.

Vsl represents the source line voltage and Vp-well represents the p-well voltage. Generally, Vsl will be similar in magnitude as Vp-well to prevent leakage in the substrate. In the pre-charge phase in a first time period from t0-t1, plot 1451 depicts a positive pre-charge voltage such as 2 V. In one option, depicted by the plot 1452, Vsl/Vp-well are reduced back to 0 V (plot 1456) at t1, at the end of the first time period. In another option, consistent with the pre-charge process D in FIG. 10, depicted by the plot 1453, Vsl/Vp-well remain at the positive voltage in a second time period from t1-t2, and are reduced back to 0 V at t2, at the end of the second time period. In the program phase, a plot 1454 depicts Vsl/Vp-well at a positive voltage to help maintain the SGS transistors in a non-conductive state. A plot 1455 shows Vsl/Vp-well also at a positive level during the verify phase.

For electron-type pre-charging from the drain side (process A in FIG. 10), Vbl, Vsgd and VWL_unsel for at least a drain-side subset 1600 of the word lines (FIG. 16) are positive, consistent with plots 1401, 1421 and 1411, respectively.

For electron-type pre-charging from the source side (process B in FIG. 10), Vsl/Vp-well, Vsgs and VWL_unsel for at least a source-side subset 1620 of the word lines (FIG. 16) are positive, consistent with plots 1451/1452, 1431 and 1411, respectively.

For hole-type pre-charging from the source side (process C in FIG. 10), Vsl/Vp-well are positive (e.g., consistent with plot 1451), and Vsgs and VWL_unsel for at least a source-side subset 1620 of the word lines (FIG. 16) are 0 V (e.g., consistent with plots 1432 and 1412, respectively) or <0 V (e.g., consistent with plots 1433 and 1413, respectively). Generally, Vwl/Vp-well are greater, e.g., about 1-4 V greater, than Vsgs and VWL_unsel for at least the subset 1620 of word lines so that the source-to-control gate voltage of the associated SGS transistors and memory cells is positive. The hole-type pre-charging is greater when Vsgs and VWL_unsel are as low as possible. In some memory devices, 0 V is the lowest voltage which can be applied to Vsgs and VWL_unsel. In other memory devices, a negative voltage such as −1 to −2 V should be used if available for Vsgs and VWL_unsel to maximize the efficiency of the hole-type pre-charging.

For process D in FIG. 10, the process B is performed at t041, consistent with the plots 1451/1452, 1431 and 1411 followed by the process C at t1-t2. For process C, plot 1453 indicates how Vsl/p-well remain at a positive voltage. Plots 1402*a* and 1403*a* indicate how VWL_sel can remain at 0 V or <0 V, respectively. Plots 1412*a* and 1413*a* indicate how VWL_unsel can remain at 0 V or <0 V, respectively. Plots 1434 and 1433*a* indicate how Vsgs can remain at 0 V or <0 V, respectively.

For process E in FIG. 10, the process A as described above can be used, including biasing the drain-side subset 1600 of the word lines, with the process C as described above, including biasing the source-side subset 1620 of the word lines.

The voltages depicted are examples.

Figure 15:
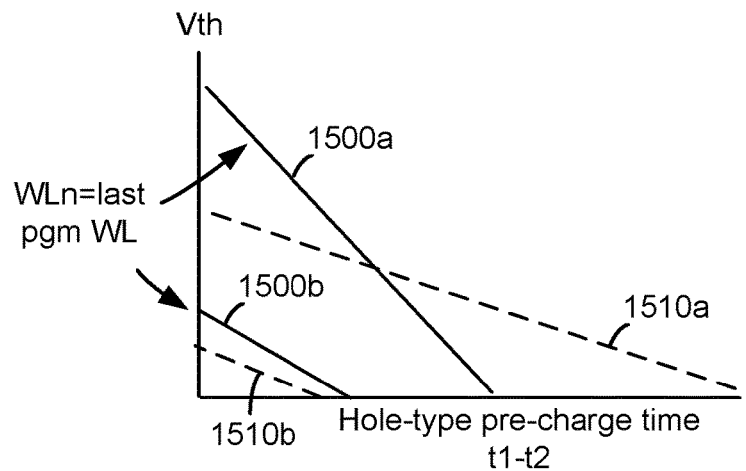
FIG. 15 depicts a plot of Vth for erased state memory cells, as a measure of program disturb, as a function of the electron-type pre-charge time period t0-t1 and the hole-type pre-charge time period t1-t2 in FIG. 14.

FIG. 15 depicts a plot of Vth for erased state memory cells, as a measure of program disturb, as a function of the electron-type pre-charge time period t0-t1 and the hole-type pre-charge time period t1-t2 in FIG. 14. The Vth represents the upper tail of the Vth distribution, and a lower value represents lower program disturb which results from better channel boosting.

As discussed, in the pre-charge process D, the electron-type pre-charge from the source-side is followed by the hole-type pre-charge from the source-side. The plots 1500*a* and 1500*b* represent the Vth when the electron-type pre-charge time period t0-t1 is relatively short or long, respectively. As expected, the Vth is reduced when the time period t0-t1 increases. The plots 1510*a* and 1510*b* represent the Vth when the hole-type pre-charge time period t1-t2 is relatively short or long, respectively. As expected, the Vth is reduced when the time period t1-t2 increases.

The plots indicate that the hole-type pre-charge is more efficient than the electron-type pre-charge when the selected word line WLn is closer to the last programmed word line in the block. Accordingly, a ratio of the second time period (t1-t2) with the hole-type pre-charge to the first time period (t041) with the electron-type pre-charge can be adjusted to optimize the channel boosting. For example, the ratio can be a function of a position of the selected word line WLn in the plurality of word lines. In one approach, the ratio is larger when WLn is closer to the last programmed word line in the block. The last programmed word line in the block can be the topmost word line when there is a bottom to top word line programming order, or the bottommost word line when there is a top to bottom word line programming order.

The ratio can be adjusted based on the risk of program disturb (PD). The ratio can be greater when the risk of program disturb greater. In one approach, a control circuit is configured to determine a risk of program disturb in the program operation and to increase the ratio when the risk of program disturb is relatively great. For example, as mentioned, the position of WLn indicates a risk of program disturb. Other risk factors for increased program disturb can include higher temperatures and a higher number of program-erase cycles for a block. The control circuit can be configured to determine a risk of program disturb in the program operation and to adjust a time period in which the holes are injected into the channel at the source end of the NAND string to be relatively long when the risk of program disturb is relatively great.

Figure 16:
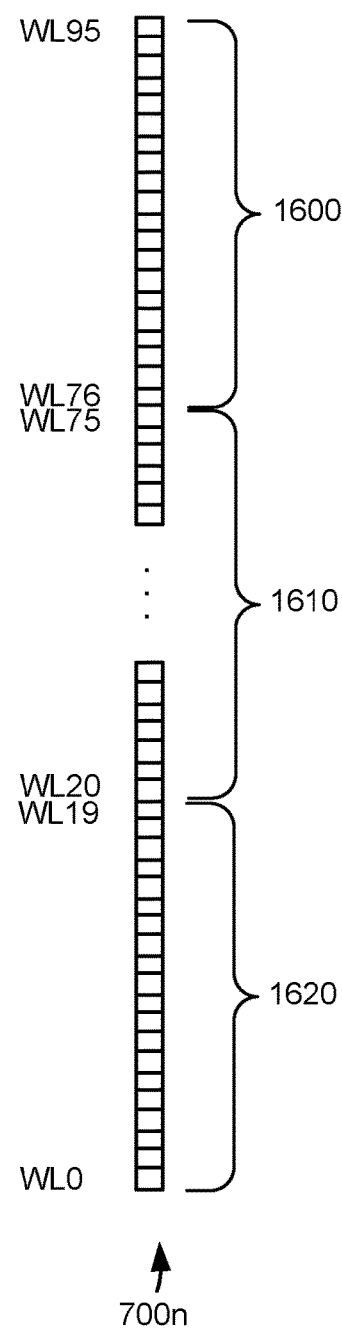
FIG. 16 depicts a plot of subsets of word lines connected to memory cells in the NAND string 700n of FIG. 7A.

FIG. 16 depicts a plot of subsets of word lines connected to memory cells in the NAND string 700*n* of FIG. 7A. The word lines range from WL0-WL19 in a source-side subset of word lines 1620, WL20-WL75 in an intermediate subset of word lines 1610 and WL76-WL95 in a drain-side subset of word lines 1600. The source-side subset of word lines and the drain-side subset of word lines can each comprise about 5-20% or up to 50% of the total number of data word lines in the block, for example. As mentioned, when pre-charging the source end of the NAND string with a pre-charge process, it can be sufficient to bias the source-side subset of word lines, but not the intermediate or drain-side subsets of word lines, for the process. Similarly, when pre-charging the drain end of the NAND string with a pre-charge process, it can be sufficient to bias the drain-side subset of word lines, but not the intermediate or source-side subsets of word lines, for the process. Different pre-charge processes, consistent with process E in FIG. 10, for example, can be used at the source and drain ends concurrently by biasing the source-side and drain-side subsets of word lines differently.

The source-side subset of the plurality of word lines comprises successive word lines (WL0-WLn−1) ranging from a source-side word line (WL0) of the plurality of word lines to a source-side adjacent word line (WLn−1) of a selected word line (WLn) among the plurality of word lines, and the drain-side subset of the plurality of word lines comprises successive word lines (WL95-WLn) ranging from a drain-side word line (WL95) to the selected word line (WLn).

Accordingly, it can be see that in one implementation, an apparatus comprises: a NAND string extending vertically in a stack of spaced apart conductive layers, the NAND string comprising a source end and a drain end, the NAND string comprising a plurality of memory cells, a source-side select gate transistor at the source end, and a channel, and the spaced apart conductive layers comprise a plurality of word lines connected to the plurality of memory cells and a source-side select gate control line connected to the source-side select gate transistor; a substrate comprising a p-well in contact with the source end of the NAND string, an n-type contact in the p-well and a p+ contact in the p-well; and a control circuit. The control circuit is configured to pre-charge the channel in a program operation, wherein to pre-charge the channel, the control circuit is configured to inject holes into the channel at the source end of the NAND string, the injecting of the holes into the channel at the source end of the NAND string comprises concurrently biasing the source-side select gate control line with a respective voltage of no more than 0 V, the n-type contact with a respective positive voltage and the p+ contact with a respective positive voltage.

In another implementation, a method comprises: pre-charging channels of NAND strings in a block in a pre-charge phase of a program loop of a program operation, the channel of each NAND string extends between a source-side select gate transistor at a source end of the NAND string and a drain-side select gate transistor at a drain end of the NAND string, the source ends of the NAND strings are connected to a substrate, the NAND strings are connected to a plurality of word lines, and the pre-charging of the channels comprises injecting holes from the substrate into the channels at the source ends of the NAND strings; and after the pre-charging of the channels, applying a program pulse to a selected word line of the plurality of word lines.

In another implementation, an apparatus comprises: a substrate; a block of memory cells arranged on the substrate in NAND strings, each NAND string comprising a source-side select gate transistor at a source end of the NAND string, a drain-side select gate transistor at a drain end of the NAND string, memory cells between the source end and the drain end, and a channel extending from the source end to the drain end, wherein the source ends of the NAND strings are connected to the substrate, the NAND strings extend upward from the substrate, and the memory cells are connected to a plurality of word lines; and a control circuit. The control circuit is configured to pre-charge the channels before applying a program voltage to a selected word line of the plurality of word lines in a program operation, wherein to pre-charge the channels, the control circuit is configured to apply respective voltage signals to the substrate, the source-side select gate transistors and the plurality of word lines for a first time period (t0-t1), the respective voltage signals initially have respective positive voltages, after which, in a second time period (t1-t2), the respective voltage signals for the source-side select gate transistors and the plurality of word lines are reduced while the respective voltage signal for the substrate remains at its respective positive level.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a NAND string extending vertically in a stack of spaced apart conductive layers, the NAND string comprising a source end and a drain end, the NAND string comprising a plurality of memory cells, a source-side select gate transistor at the source end, and a channel, and the spaced apart conductive layers comprise a plurality of word lines connected to the plurality of memory cells and a source-side select gate control line connected to the source-side select gate transistor;
a substrate comprising a p-well in contact with the source end of the NAND string, an n-type contact in the p-well and a p+ contact in the p-well; and
a control circuit, the control circuit is configured to pre-charge the channel in a program operation, wherein to pre-charge the channel, the control circuit is configured to inject holes into the channel at the source end of the NAND string, the injecting of the holes into the channel at the source end of the NAND string comprises concurrently biasing the source-side select gate control line with a respective voltage of no more than 0 V, the n-type contact with a respective positive voltage and the p+ contact with a respective positive voltage.

2. The apparatus of claim 1, wherein:
the respective voltage of the source-side select gate control line is a negative voltage.

3. The apparatus of claim 1, wherein:
to inject the holes into the channel at the source end of the NAND string, the control circuit is configured to bias a source-side subset of the plurality of word lines at the source end of the NAND string with a respective voltage of no more than 0 V concurrent with the biasing of the source-side select gate control line with the respective voltage of no more than 0 V, the n-type contact with the respective positive voltage and the p+ contact with the respective positive voltage.

4. The apparatus of claim 3, wherein:
the respective voltage of the source-side subset of the plurality of word lines is a negative voltage.

5. The apparatus of claim 1, wherein:
to pre-charge the channel, before the injecting of the holes into the channel at the source end of the NAND string, the control circuit is configured to extract electrons from the channel at the source end of the NAND string, the extracting of the electrons from the channel at the source end of the NAND string comprises concurrently biasing a source-side subset of the plurality of word lines at the source end of the NAND string with a respective positive voltage, the source-side select gate control line with a respective positive voltage, the n-type contact with a respective positive voltage and the p+ contact with a respective positive voltage.

6. The apparatus of claim 5, wherein:
the program operation comprises a top to bottom word line programming order in the stack.

7. The apparatus of claim 1, wherein:
the NAND string comprises a drain-side select gate transistor at the drain end;
the spaced apart conductive layers comprise a drain-side select gate control line connected to the drain-side select gate transistor; and
to pre-charge the channel, during the injecting of the holes into the channel at the source end of the NAND string, the control circuit is configured to extract electrons from the channel at the drain end of the NAND string, the extracting electrons from the channel at the drain end of the NAND string comprises concurrently biasing a drain-side subset of the plurality of word lines at the drain end of the NAND string with a respective positive voltage, the drain-side select gate control line with a respective positive voltage and the drain end with a respective positive voltage.

8. The apparatus of claim 7, wherein:
the extracting of the electrons from the channel at the drain end of the NAND string comprises biasing a drain-side subset of the plurality of word lines at the drain end of the NAND string with a respective positive voltage.

9. The apparatus of claim 8, wherein:
the injecting of the holes into the channel at the source end of the NAND string comprises biasing a source-side subset of the plurality of word lines at the source end of the NAND string with a respective voltage of no more than 0 V, concurrent with the biasing of the drain-side subset of the plurality of word lines at the drain end of the NAND string with the respective positive voltage.

10. The apparatus of claim 9, wherein:
the source-side subset of the plurality of word lines comprises successive word lines ranging from a source-side word line of the plurality of word lines to a source-side adjacent word line of a selected word line among the plurality of word lines; and
the drain-side subset of the plurality of word lines comprises successive word lines ranging from a drain-side word line to the selected word line.

11. The apparatus of claim 9, wherein:
the respective voltage of the source-side subset of the plurality of word lines is a negative voltage.

12. A method, comprising:
pre-charging channels of NAND strings in a block in a pre-charge phase of a program loop of a program operation, the channel of each NAND string extends between a source-side select gate transistor at a source end of the NAND string and a drain-side select gate transistor at a drain end of the NAND string, the source ends of the NAND strings are connected to a substrate, the NAND strings are connected to a plurality of word lines, and the pre-charging of the channels comprises injecting holes from the substrate into the channels at the source ends of the NAND strings; and
after the pre-charging of the channels, applying a program pulse to a selected word line of the plurality of word lines.

13. The method of claim 12, wherein:
a plurality of word lines are connected to memory cells of the NAND strings;
a control line is connected to the source-side select gate transistor; and
the injecting of the holes from the substrate into the channels at the source ends of the NAND strings comprises applying a positive voltage to the substrate and a voltage of no more than 0 V to the control line and to a subset of the plurality of word lines which is adjacent to the source-side select gate transistors.

14. The method of claim 12, wherein:
the pre-charging of the channels comprises extracting electrons from the channels into the substrate at the source ends of the NAND strings, separately in time from the injecting holes from the substrate into the channels at the source ends of the NAND strings.

15. The method of claim 12, wherein:
the drain ends of the NAND strings are connected to respective bit lines; and
the pre-charging of the channels comprises extracting electrons from the channels into the bit lines at the drain ends of the NAND strings concurrently with the injecting of the holes from the substrate into the channels at the source ends of the NAND strings.

16. An apparatus, comprising;
a substrate;
a block of memory cells arranged on the substrate in NAND strings, each NAND string comprising a source-side select gate transistor at a source end of the NAND string, a drain-side select gate transistor at a drain end of the NAND string, memory cells between the source end and the drain end, and a channel extending from the source end to the drain end, wherein the source ends of the NAND strings are connected to the substrate, the NAND strings extend upward from the substrate, and the memory cells are connected to a plurality of word lines; and
a control circuit, the control circuit is configured to pre-charge the channels before applying a program voltage to a selected word line of the plurality of word lines in a program operation, wherein to pre-charge the channels, the control circuit is configured to apply respective voltage signals to the substrate, the source-side select gate transistors and the plurality of word lines for a first time period, the respective voltage signals initially have respective positive voltages, after which, in a second time period, the respective voltage signals for the source-side select gate transistors and the plurality of word lines are reduced while the respective voltage signal for the substrate remains at its respective positive level.

17. The apparatus of claim 16, wherein:
a level to which the respective voltage signals for the source-side select gate transistors and the plurality of word lines are reduced is no more than 0 V.

18. The apparatus of claim 16, wherein:
a level to which the respective voltage signals for the source-side select gate transistors and the plurality of word lines are reduced is a negative voltage.

19. The apparatus of claim 16, wherein:
the second time period is a function of a position of the selected word line in the plurality of word lines.

20. The apparatus of claim 16, wherein:
a ratio of the second time period to the first time period is a function of a position of the selected word line in the plurality of word lines.

* * * * *